United States Patent
Roo et al.

(10) Patent No.: US 8,253,441 B1
(45) Date of Patent: Aug. 28, 2012

(54) CIRCUITS AND METHODS FOR LEVEL SHIFTING A SIGNAL

(75) Inventors: Pierte Roo, Sunnyvale, CA (US); Talip Ucar, San Francisco, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/053,933

(22) Filed: Mar. 22, 2011

Related U.S. Application Data (63) Continuation of application No. 12/776,860, filed on May 10, 2010, now Pat. No. 7,915,921.

(60) Provisional application No. 61/178,660, filed on May 15, 2009.

(51) Int. Cl.
*H03K 19/00* (2006.01)
(52) U.S. Cl. ............... 326/81; 326/87; 326/67
(58) Field of Classification Search ............ 326/63, 326/68–71, 80, 81, 83, 87, 93–98
See application file for complete search history.

(56) References Cited

U.S. PATENT DOCUMENTS

| | | | |
|---|---|---|---|
| 7,511,554 B2 | 3/2009 | Kaneko et al. | |
| 7,564,263 B2 | 7/2009 | Walker et al. | |
| 7,659,754 B2 | 2/2010 | Thiele et al. | |
| 7,986,164 B2 * | 7/2011 | Pertijs | 326/62 |
| 8,111,088 B2 * | 2/2012 | Srivastava et al. | 326/68 |
| 2006/0197554 A1 | 9/2006 | Jinta | |

* cited by examiner

*Primary Examiner* — Don Le (57) ABSTRACT

In one embodiment, the present disclosure includes a level shift circuit. The level shift circuit includes a clocked latch to receive a digital data signal and a complement of the digital data signal. Outputs of the clocked latch are coupled to inputs of a second latch through capacitors. The clocked latch is powered by first and second power supply voltages that are different than third and fourth power supply voltages used for powering the second latch. Latch output signals from the second latch have high and low voltage values at the third and fourth power supply voltages. In one embodiment, transistors in circuitry driven by the level shift circuit may receive output signals from the level shift circuit that have high and low voltage values within a safe operating range of the transistor receiving the output signal.

20 Claims, 6 Drawing Sheets

CIRCUITS AND METHODS FOR LEVEL SHIFTING A SIGNAL

CROSS REFERENCE TO RELATED APPLICATIONS

This application is a continuation of U.S. application Ser. No. 12/776,860, filed May 10, 2010, which claims priority under 35 U.S.C. §119(e) to U.S. Provisional Application No. 61/178,660, filed May 15, 2009. The disclosures of the applications referenced above are incorporated herein by reference.

BACKGROUND

The present disclosure relates to level shifting circuits and methods

Unless otherwise indicated herein, the approaches described in this section are not prior art to the claims in this application and are not admitted to be prior art by inclusion in this section.

In many electronic systems, different circuits are powered by different power supply voltages. When signals are communicated between different circuits powered by different power supply voltages, the signals are typically level shifted to be operable under new power supply voltage conditions.

Figure 1:
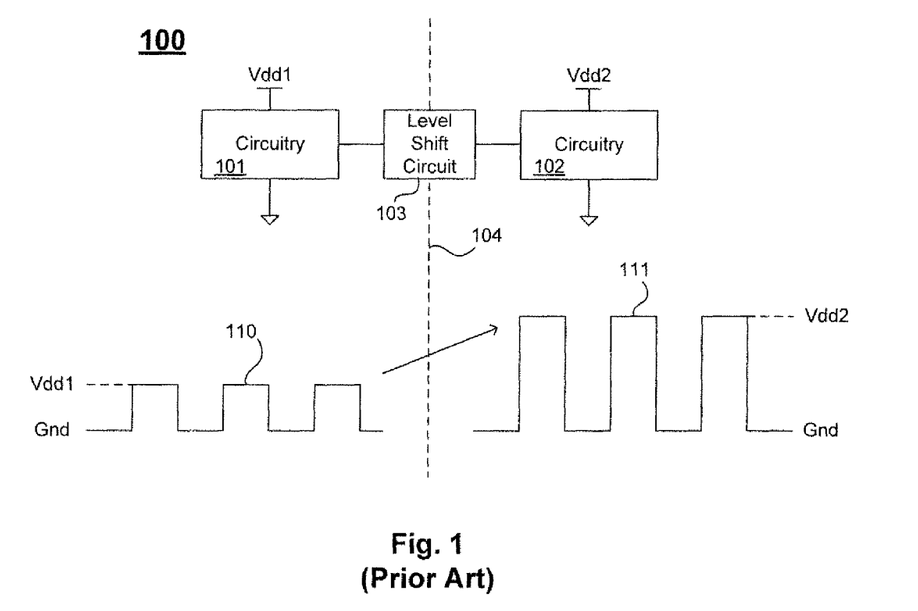
FIG. 1 illustrates prior art level shifting.

FIG. 1 illustrates prior art level shifting. In circuit 100, circuitry 101 is connected to power supply voltage Vdd1 and ground. Similarly, circuitry 102 is connected to power supply voltage Vdd2 and ground. In this example, Vdd2 is greater than Vdd1. Circuit 100 includes a level shift circuit 103 for modifying signals that are transmitted from circuitry 101 to circuitry 102 across a power supply boundary 104. Power supply boundary 104 distinguishes between signal levels in circuitry 101 and circuitry 102, which are powered by different power supply voltages.

As illustrated in FIG. 1, a signal 110 may have a low level of zero volts (i.e., ground) and a high level of Vdd1. Level shift circuit 103 may produce a modified signal 111 having a low level of zero volts and a high level of Vdd2. Thus, signal 110 and modified signal 111 have the same low level of zero volts. One example of a level shift operation is translating a 0-1.8 v signal used in one part of a system to a 0-3.3 v signal used in another part of the system.

SUMMARY

Embodiments of the present disclosure improve level shifting circuits and methods. In one embodiment, the present disclosure includes a circuit comprising a clocked latch, second latch, and first and second capacitors. The clocked latch has a first input to receive a digital data signal, a second input to receive a complement of the digital data signal, and a third input to receive a clock signal. The second latch has a first input, a second input, a first output, and a second output. The first capacitor has a first terminal coupled to a first output of the clocked latch and a second terminal coupled to the first input of the second latch. The second capacitor has a first terminal coupled to a second output of the clocked latch and a second terminal coupled to the second input of the second latch. The first output and second output of the second latch are responsive, synchronously, to the digital data signal, the complement of the digital data signal, and the clock signal received by the clocked latch. Additionally, the clocked latch receives a first power supply voltage and a second power supply voltage, where the first power supply voltage is greater than the second power supply voltage. Further, the second latch receives a third power supply voltage and a fourth power supply voltage, where the third power supply voltage is greater than the fourth power supply voltage. Finally, the first power supply voltage is different than the third power supply voltage and the second power supply voltage is different than the fourth power supply voltage.

In one embodiment, the fourth power supply voltage is greater than the first power supply voltage.

In one embodiment, a first difference between the first power supply voltage and the second power supply voltage is the same as a second difference between the third power supply voltage and the fourth power supply voltage.

In one embodiment, a first difference between the first power supply voltage and the second power supply voltage is the less than a second difference between the third power supply voltage and the fourth power supply voltage.

In one embodiment, the circuit further comprises a first transistor of a first conductivity type having a gate coupled to the first output of the second latch and a second transistor of a second conductivity type having a gate coupled to the first output of the clocked latch, wherein the first transistor includes a source coupled to the third power supply voltage, and wherein the second transistor includes a source coupled to the second power supply voltage.

In one embodiment, the clocked latch comprises a first switch having an input to receive the digital data signal, an output, and a control terminal to receive the clock signal, a second switch having an input to receive the complement of the digital data signal, an output, and a control terminal to receive the clock signal, a first transistor having a drain coupled to the output of the first switch and a gate coupled to the output of the second switch, and a second transistor having a drain coupled to the output of the second switch and a gate coupled to the output of the first switch.

In one embodiment, the first switch is a first CMOS transistor and the second switch is a second CMOS transistor.

In one embodiment, the second latch comprises a first transistor of first conductivity type having a source, a drain, and a gate, where the source is coupled to the third power supply voltage, a second transistor of second conductivity type having a source coupled to the fourth power supply voltage, a drain coupled to the drain of the first transistor, and a gate coupled to the gate of the first transistor and to the second terminal of the first capacitor, a third transistor of a first conductivity type having a source, a drain, and a gate, wherein the source coupled to the third power supply voltage, and a fourth transistor of a second conductivity type having a source coupled to the fourth power supply voltage, a drain coupled to the drain of the third transistor, and a gate coupled to the gate of the third transistor and to the second terminal of the second capacitor.

In one embodiment, the circuit further comprises first and second current sources and fifth and sixth transistors. The first current source is between the third power supply voltage and a first node. The fifth transistor is of the first conductivity type and is between the first current source and the third power supply voltage. The second current source is between the second power supply voltage and the first node. The sixth transistor is of the second conductivity type and is between the second current source and the second power supply voltage. A gate of the fifth transistor is coupled to the drain of the first transistor and a gate of the sixth transistor is coupled to the first terminal of the first capacitor.

In one embodiment, the circuit further comprises a fifth transistor having a source coupled to the first power supply voltage, a drain coupled to the first terminal of the first capacitor, and a gate coupled to receive a first power down signal, a sixth transistor having a source coupled to the second power supply voltage, a drain coupled to the first terminal of the second capacitor, and a gate coupled to receive a complement of the first power down signal, a seventh transistor having a source coupled to the third power supply voltage, a drain coupled to the second terminal of the first capacitor, and a gate coupled to receive a second power down signal, and an eighth transistor having a source coupled to the fourth power supply voltage, a drain coupled to the second terminal of the second capacitor, and a gate coupled to receive a complement of the second power down signal.

In another embodiment, the present disclosure includes a method comprising receiving a digital data signal and a complement of the digital data signal, coupling the digital data signal and the complement of the digital data signal, synchronously, into a clocked latch in response to a clock signal to produce a first latch output signal and a complement of the first latch output signal, and coupling the first latch output signal through a first capacitor to a second latch and coupling the complement of the first latch output signal through a second capacitor to the second latch to produce a second latch output signal and a complement of the second latch output signal, where the clocked latch receives a first power supply voltage and a second power supply voltage, wherein the first power supply voltage is greater than the second power supply voltage, the second latch receives a third power supply voltage and a fourth power supply voltage, wherein the third power supply voltage is greater than the fourth power supply voltage, and the first power supply voltage is different than the third power supply voltage and the second power supply voltage is different than the fourth power supply voltage.

In one embodiment, the method further comprises coupling the complement of the second latch output signal to a gate of a first transistor, wherein the first transistor comprises a source coupled to the third power supply voltage and coupling the first latch output signal to a gate of a second transistor, wherein the second transistor comprises a source coupled to the fourth power supply voltage.

In one embodiment, the method further comprises activating a first current source between a first node and the third power supply voltage in response to the complement of the second latch output signal and activating a second current source between the first node and the second power supply voltage in response to the first latch output signal.

In one embodiment, the method further comprises setting a voltage on the first capacitor to a first value during a power down mode and setting a voltage on the second capacitor to a second value during the power down mode.

In one embodiment said circuit is an integrated circuit.

In one embodiment the present disclosure includes an electronic system including a circuit or method described herein.

In one embodiment the present disclosure includes a digital to analog converter including a circuit or method described herein.

The following detailed description and accompanying drawings provide a better understanding of the nature and advantages of the present invention.

DETAILED DESCRIPTION

Described herein are techniques for level shifting. In the following description, for purposes of explanation, numerous examples and specific details are set forth in order to provide a thorough understanding of particular embodiments. The circuits and methods disclosed herein may be used in a variety of electronic systems. Further, the circuits and methods describe herein may be implemented on an integrated circuit (IC). Particular embodiments as defined by the claims may include some or all of the features in these examples alone or in combination with other features described below, and may further include modifications and equivalents of the features and concepts described herein.

Figure 2A:
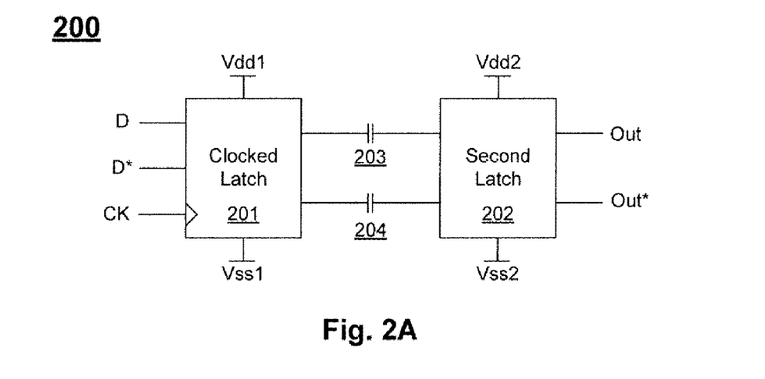
FIG. 2A shows a level shift circuit according to one embodiment.

FIG. 2A shows a level shift circuit 200 according to one embodiment. Circuit 200 includes a clocked latch 201, capacitors 203 and 204, and a second latch 202. Clocked latch 201 has a first input to receive a digital data signal ("D") and a second input to receive a complement of the digital data signal ("D*"). Clocked latch 201 further includes a third input to receive a clock signal ("CK"). Capacitor 203 has a first terminal coupled to a first output of clocked latch 201 and a second terminal coupled to a first input of second latch 202. Similarly, capacitor 204 has a first terminal coupled to a second output of clocked latch 201 and a second terminal coupled to a second input of second latch 202. Features and advantages of the present disclosure include using power supply voltages to power clocked latch 201 that are different than power supply voltages used to power second latch 202. For instance, clocked latch 201 receives a first power supply voltage, Vdd1, and a second power supply voltage, Vss1, where Vdd1 is greater than Vss1. Similarly, second latch 202 receives a third power supply voltage, Vdd2, and a fourth power supply voltage, Vss2, where Vdd2 is greater than Vss2. Further, in one embodiment, Vdd1 is different than Vdd2 and Vss1 is different than Vss2.

Capacitors 203 and 204 provide alternating current (AC) coupling between the clocked latch 201 and the second latch 202 so that a low voltage level and a high voltage level of a digital data signal and the complement of the digital data signal may be shifted to different voltages. As mentioned above, digital data signal, D, is received at the first input of clocked latch 201; the complement of the digital data signal, D*, is received at the second input of clocked latch 201; and the clock signal, CK, is received at the third input of clocked latch 201. Clocked latch 201 produces a latch output signal on the first output and a complement of the latch output signal on the second output in response to the clock signal, CK. Digital data signal D and the complement of the digital data signal D* have a low voltage level of Vss1 and a high voltage level of Vdd1. Because clocked latch 201 is powered by Vdd1 and Vss1, the latch output signal on the first output of clocked latch 201 and the complement of the latch output signal on the second output of clocked latch 201 have a low voltage level of Vss1 and a high voltage level of Vdd1.

Second latch 202 is powered by different power supply voltages Vdd2 and Vss2. The latch output signal and complement of the latch output signal produced by clocked latch 201 are AC coupled to the inputs of second latch 202. Because second latch 202 is powered by Vdd2 and Vss2, an output signal ("Out") on the first output of second latch 202 and the complement of the output signal ("Out*") on the second output of second latch 202 have a low voltage level of Vss2 and a high voltage level of Vdd2. Further, because the latch output signals of clocked latch 201 are produced in response to the clock signal, the first output and second output of the second latch 202 are responsive, synchronously, to the digital data signal, the complement of the digital data signal, and the clock signal received by clocked latch 201. For example, if clocked latch 201 is triggered by a rising edge of CK, then the outputs of second latch 202 change to high and low voltage levels as determined by the voltage states of signals D and D* after a rising edge of CK.

Figure 2B:
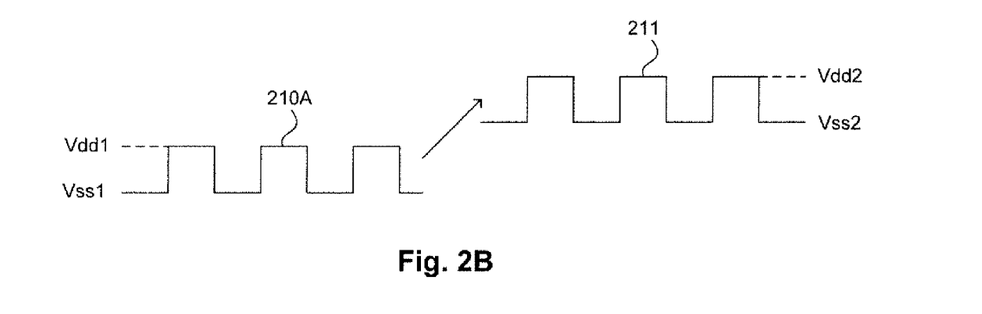
FIGS. 2B-C show waveforms for the level shift circuit of FIG. 2A.
Figure 2C:
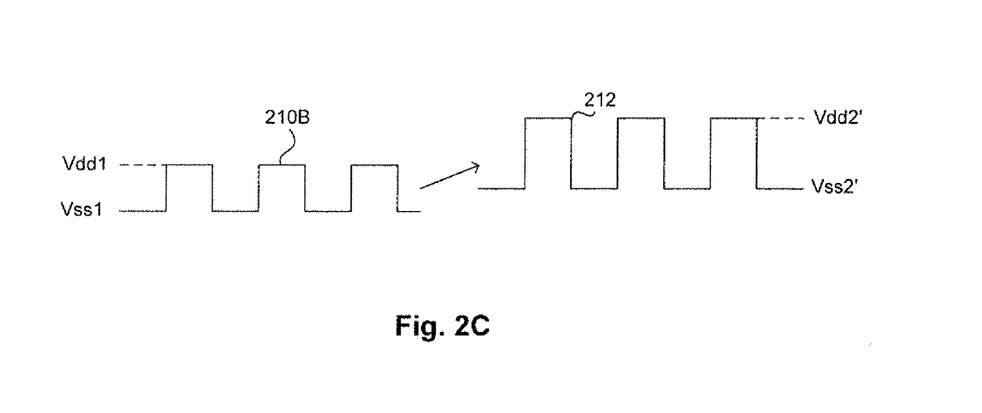

The flexibility of level shift circuit 200 is illustrated by the waveforms shown in FIG. 2B and FIG. 2C. In FIG. 2B, a digital data signal having a waveform 210A may be shifted to have a waveform 211, which is an output signal of second latch 202. In FIG. 2B, the digital data signal has a high voltage level of Vdd1 and a low voltage level of Vss1. As shown in waveform 211, the high voltage level is shifted to Vdd2, where Vdd2 is greater than Vdd1, and the low voltage level is shifted to Vss2, where Vss2 is greater than Vss1. Additionally, in this example, the low power supply voltage Vss2 is greater than the high power supply voltage Vdd1 so that the entire waveform 211 is shifted above Vdd1. However, in this example, a difference between Vdd1 and Vss1 is the same as a difference between Vdd2 and Vss1, so that the amplitude of waveform 211 is unchanged.

FIG. 2C illustrates waveforms for another implementation of circuit 200. In this case, a difference between the Vdd1 and Vss1 is the less than a difference between Vdd2' and Vss2'. Thus, the amplitude of waveform 210B is increased by level shift circuit 200 to produce a waveform 212. Additionally, in FIG. 2C, the low power supply voltage Vss2' is less than the high power supply voltage Vdd1. It is to be understood that a variety of voltages may be used for the power supply voltages described above.

Figure 3:
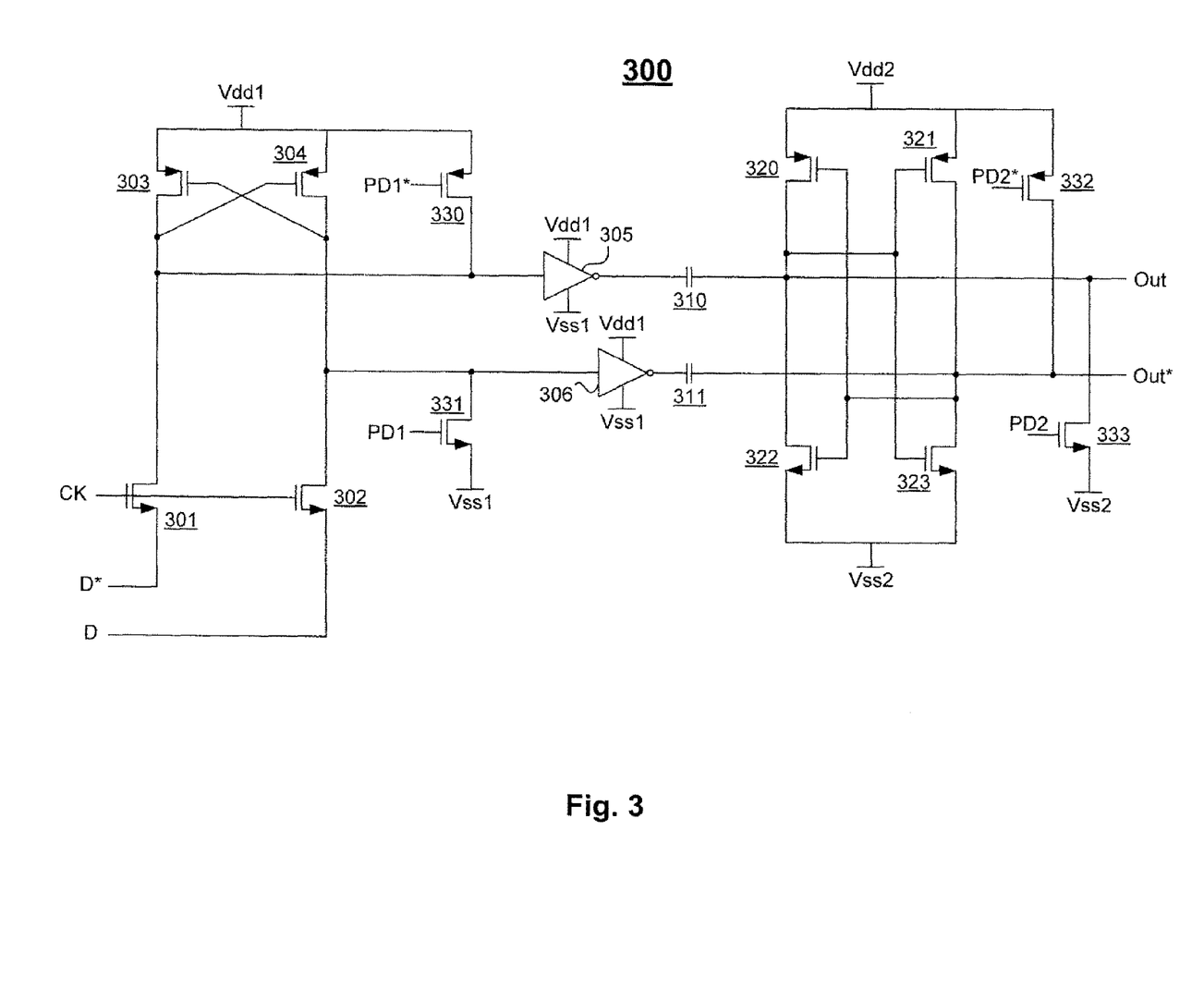
FIG. 3 shows one implementation of a level shift circuit according to another embodiment.

FIG. 3 shows one implementation of a level shift circuit 300 according to another embodiment. In this example, level shift circuit 300 is implemented using complementary metal-oxide-semiconductor (CMOS) transistors having "P" or "N" conductivity types (e.g., PMOS and NMOS). Digital data signals D and D* are coupled to cross coupled PMOS transistors 303 and 304 through switches that are opened and closed in response to clock signal CK. In this example, the low voltage value for signals CK, D, and D* is Vss1 and the high voltage value for signals D and D* is Vdd1. Further, the switches are implemented using NMOS transistors 301 and 302.

When clock signal CK is in a low voltage state, NMOS transistors 301 and 302 are off (e.g., switch opened), and the voltage values of digital data signals D and D* are decoupled from PMOS transistors 303 and 304. However, when CK is in a high voltage state, NMOS transistors 301 and 302 are on (i.e., the switch is closed). Accordingly, the voltage value of digital data signal D is coupled to a drain of PMOS transistor 303 through NMOS transistor 301 and the voltage value of digital data signal D* is coupled to a drain of PMOS transistor 304 through NMOS transistor 302.

PMOS transistors 303 and 304 are configured to store the voltage values. A gate of PMOS transistor 303 is coupled to the drain of PMOS transistor 304 and a gate of PMOS transistor 304 is coupled to the drain of PMOS transistor 303. Sources of PMOS transistors 303 and 304 are both coupled to Vdd1. Accordingly, the voltage values of D and D* are stored on PMOS transistors 303 and 304 when clock signal CK transitions from a low voltage value to a high voltage value. In this example, the voltage on the drain of PMOS transistor 303 is the first latch output signal and the voltage on the drain of PMOS transistor 304 is the complement of the first latch output signal.

The drain of PMOS transistor 303 is coupled to a first terminal of a capacitor 310. Similarly, the drain of PMOS transistor 304 is coupled to a first terminal of a capacitor 311. In this example, the first latch output signal is coupled to the first terminal of capacitor 310 through an inverter 305 and the complement of the first latch output signal is coupled to the first terminal of capacitor 311 through an inverter 306. Inverters 305 and 306 are powered by power supply voltages Vdd1 and Vss1, so the high and low voltage values of the latch output signals at the terminals of capacitors 310 and 311 are Vdd1 and Vss1, respectively.

A second terminal of capacitor 310 is coupled to a gate of NMOS transistor 323 and a gate of PMOS transistor 321. A source of NMOS transistor 323 is coupled to a power supply voltage, Vss2, and a source of PMOS transistor 321 is coupled to a power supply voltage, Vdd2. Drains of transistors 323 and 321 are coupled together. The drains of transistors 323 and 321 are further coupled to a second terminal of capacitor 311.

Similarly, a second terminal of capacitor 311 is coupled to a gate of PMOS transistor 320 and a gate of NMOS transistor 322. Source of NMOS transistor 322 is coupled to a power supply voltage, Vss2, and a source of PMOS transistor 320 is coupled to a power supply voltage, Vdd2. Drains of transistors 320 and 322 are coupled together. The drains of transistors 320 and 322 are further coupled to the second terminal of capacitor 310.

Transistors 320, 321, 322, and 323 form a cross coupled latch circuit to store voltage values received from capacitors 310 and 311. The drains of transistors 320 and 322 are coupled to a first output and produce a second latch output signal, OUT, and the drains of transistors 321 and 323 are coupled to a second output and produce a complement of the second latch output signal, OUT*.

Level shift circuit 300 further includes circuitry to control an initial state of the circuit. For instance, if the circuit is powered down, it is advantageous to set the voltages on the capacitors. In this example, a voltage on capacitor 310 is set to a first value during a power down mode, and a voltage on capacitor 311 is set to a second value during the power down mode. Level shift circuit 300 includes a PMOS transistor 330 to set a voltage on the first terminal of capacitor 310 and an NMOS transistor 331 to set a voltage on the first terminal of capacitor 311. NMOS transistor 331 has a source coupled to Vss1, a drain coupled to the first terminal of capacitor 311 (e.g., through inverter 306), and a gate coupled to receive a first power down signal, PD1. Similarly, PMOS transistor 330 has a source coupled to Vdd1, a drain coupled to the first terminal of capacitor 310 (e.g., through inverter 305), and a gate coupled to receive a complement of the first power down signal, PD1*. In this example, when the first power down signals PD1 and PD1* are activated (e.g., PD1 is at a high voltage and PD1* is at a low voltage), the first terminal of capacitor 310 is set to Vss1 and the first terminal of capacitor 311 is set to Vdd1.

Level shift circuit 300 further includes NMOS transistor 333 to set a voltage on the second terminal of capacitor 310 and PMOS transistor 332 to set a voltage on the second terminal of capacitor 311. NMOS transistor 333 has a source coupled to Vss2, a drain coupled to the second terminal of capacitor 310, and a gate coupled to receive a second power down signal, PD2. Similarly, PMOS transistor 332 has a source coupled to Vdd2, a drain coupled to the second terminal of capacitor 311, and a gate coupled to receive a complement of the second power down signal, PD2*. In this example, when PD2 is at a high voltage and PD2* is at a low voltage, the second terminal of capacitor 310 is set to Vss2 and the second terminal of capacitor 311 is set to Vdd2. Accordingly, during power down, the voltage value on capacitor 310 is set to the difference between Vss1 and Vss2 and the voltage value on capacitor 311 is set to the difference between Vdd1 and Vdd2.

Figure 4:
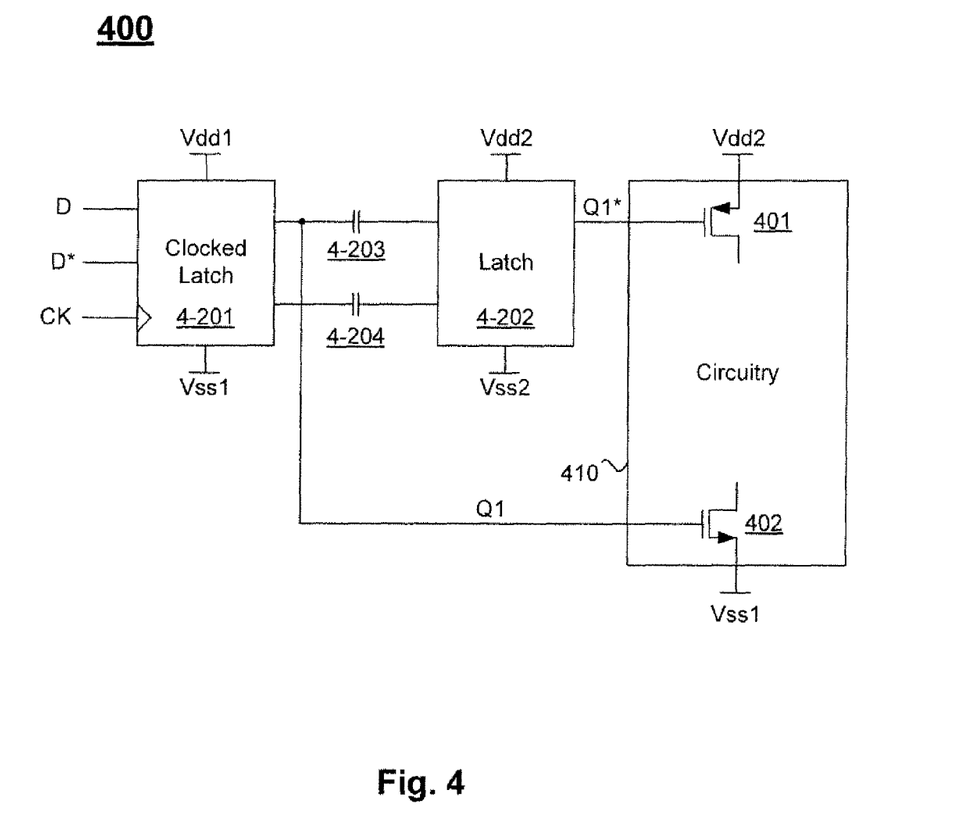
FIG. 4 shows a circuit according to yet another embodiment.

FIG. 4 shows a circuit 400 according to yet another embodiment. Circuit 400 includes a clocked latch 4-201, second latch 4-202, and capacitors 4-203 and 4-204 as described in FIG. 2. In this example, latch output signals Q1 and Q1* are used drive transistors of different conductivity types across different ranges of operation. For example, a PMOS transistor 401 in circuitry 410 includes a gate coupled to the output of second latch 4-202 and a source coupled to power supply voltage Vdd2. As described above with regard to FIG. 2, second latch output signal Q1* produced by second latch 4-202 has a low voltage value of Vss2 and a high voltage value of Vdd2.

Features and advantages of particular embodiments include producing different latch output signals across different voltage ranges to drive transistors across different safe operating ranges. In this case, circuitry 410 is powered by Vdd2 and Vss1. However, some transistors in circuitry 410 may not be operable across the entire voltage range Vdd2-Vss1 (e.g., such transistors may break down if the full voltage range Vdd2-Vss1 is applied across the transistor's gate, drain, or source). In this example, since the source of PMOS transistor 401 is coupled to Vdd2, the signal used to drive PMOS transistor 401 is level shifted to within a safe operating range of PMOS transistor 401. Here, second latch output signal Q1* has a range from Vdd2 to Vss2, where Vss2 is above Vss1 and sufficiently low to turn PMOS transistor 401 on, but sufficiently high to prevent PMOS transistor 401 from breaking down.

Similarly, NMOS transistor 402 in circuitry 410 includes a gate coupled to the output of clocked latch 4-201 and a source coupled to power supply voltage Vss1. Latch output signal Q1 produced by clocked latch 4-201 has a low voltage value of Vss1 and a high voltage value of Vdd1. In this case, latch output signal Q1 has a range from Vdd1 to Vss1, where Vdd1 is below Vdd2 and sufficiently high to turn NMOS transistor 402 on, but sufficiently low to prevent NMOS transistor 402 from breaking down. Accordingly, latch output signal Q1* is a level shifted complement of Q1. While the above circuit 400 illustrates using a single level shift circuit for driving a PMOS transistor coupled directly to Vdd2 and an NMOS transistor coupled directly to Vss1, it is to be understood that multiple level shift circuits could be used to drive transistors across other safe operating ranges.

Figure 5:
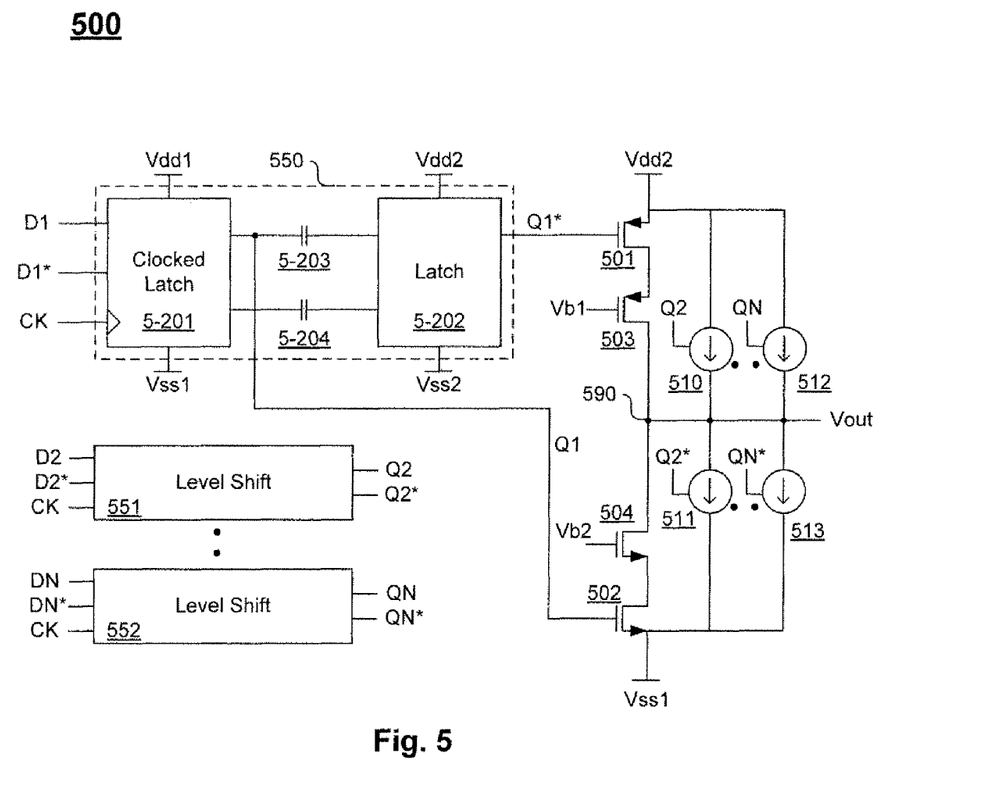
FIG. 5 shows a digital to analog converter circuit according to an embodiment.

Particular embodiments may be used in different systems. For example, FIG. 5 shows a digital to analog converter ("DAC") circuit 500 according to an embodiment. DAC circuit 500 may be part of an electronic system and may be implemented as part of an integrated circuit ("IC"), for example. In this application, digital data signals D1-DN, where N is an integer, are used to activate and de-activate current sources 503, 504, and 510-513. The current sources drive a node 590, which is the output of the DAC ("Vout"). The voltage on node 590 can be manipulated by activating or de-activating the current sources using digital data signals D1-DN. Multiple level shift circuits 550, 551, and 552 may be used to activate and de-activate current sources 503, 504, and 510-513. For instance, level shift circuit 550 receives digital data signals D1 and D1* and clock signal CK. Clocked latch 5-201 produces a first latch output signal Q1 and second latch 5-202 produces a second latch output signal Q1*, where Q1* is a level shifted complement of Q1. Output signals Q1 and Q1* are used to activate and de-activate transistors 504 and 503, respectively, which are configured as current sources biased by voltages Vb1 and Vb2. Additionally, other digital data signals D2-DN may be received by level shift circuits 551-552 to produce signals Q2 and Q2* through QN and QN* to activate and de-activate current sources 510-513.

More specifically, a first current source may be implemented using a PMOS transistor 503 configured between Vdd2 and node 590. PMOS transistor 503 includes a gate coupled to a bias voltage, Vb1, and a drain coupled to node 590. A source of PMOS transistor 503 is coupled to Vdd2 through PMOS transistor 501. PMOS transistor 501 includes a gate coupled to an output of second latch 5-202 to receive signal Q1*. If the implementation shown in FIG. 3 is used for the level shift circuit, the gate of PMOS transistor 501 may be coupled to the drains of transistors 321 and 323, for example. PMOS transistor 501 operates in a similar manner as PMOS transistor 401 in FIG. 4 as described above. When signal Q1* is low, PMOS transistor 501 is turned on, and PMOS transistor 503 sources current into node 590. When signal Q1* is high, PMOS transistor 501 is turned off, and PMOS transistor 503 is de-activated.

Similarly, a second current source may be implemented using NMOS transistor 504 configured between node 590 and Vss1. NMOS transistor 504 includes a gate coupled to a bias voltage, Vb2, and a drain coupled to node 590. A source of NMOS transistor 504 is coupled to Vss1 through NMOS transistor 502. NMOS transistor 502 includes a gate coupled to an output of clocked latch 5-201 and a first terminal of capacitor 5-203 to receive Q1. If the implementation shown in FIG. 3 is used for the level shift circuit, the gate of NMOS transistor 502 may be coupled to the output of inverter 305, for example. NMOS transistor 502 operates in a similar manner as NMOS transistor 402 in FIG. 4 as described above. When Q1 is high, NMOS transistor 502 is turned on, and NMOS transistor 504 sources current out of node 590. When Q1 is low, NMOS transistor 502 is turned off, and NMOS transistor 504 is de-activated. Current sources 510-513 may be configured in the same manner as transistors 501-504.

Figure 6A:
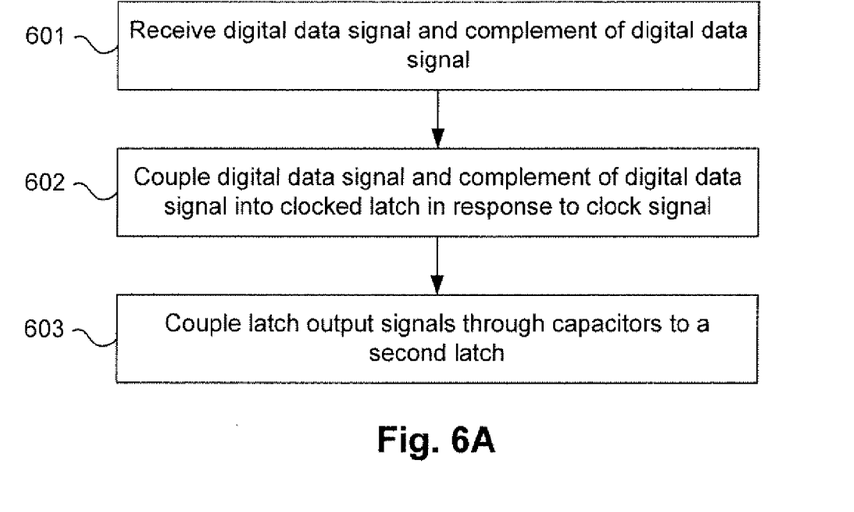
FIGS. 6A-B show methods according to an embodiment.

FIG. 6A shows a method of level shifting according to an embodiment. At 601, a digital data signal and complement of the digital data signal are received. At 602, the digital data signal and complement of the digital data signal are coupled into clocked latch 201 in response to a clock signal. At 603, latch output signals are coupled through capacitors to second latch 202. As mentioned above, clocked latch 201 receives power supply voltages Vdd1 and Vss1, where Vdd1 is greater than Vss1. Further, second latch 202 receives Vdd2 and Vss2, where Vdd2 is greater than Vss2, and where Vdd1 is different than Vdd2 and Vss1 is different than Vss2.

Figure 6B:
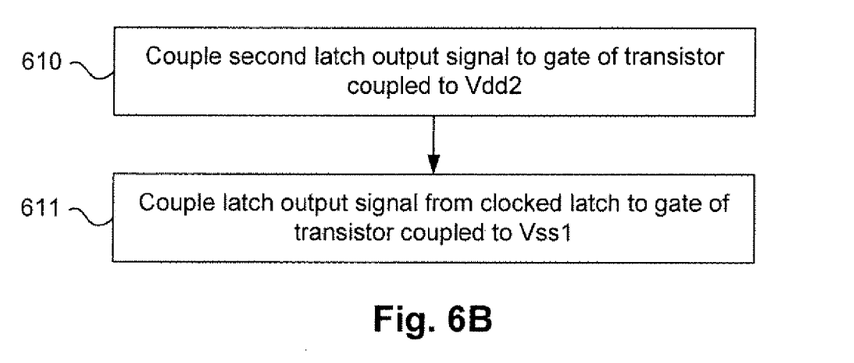

FIG. 6B shows a method according to an embodiment. At 610, a first latch output signal from clocked latch 201 is coupled to a gate of a first transistor having a source coupled to Vss1. The first latch output signal has high and low voltage values within the safe operating range of the first transistor. At 611, a second latch output signal is coupled to a gate of a second transistor having a source coupled to Vdd2. The second latch output signal has high and low voltage values within the safe operating range of the second transistor.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, while the above embodiments have been disclosed using PMOS and NMOS, other embodiments may use other types of transistors. As a further example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

What is claimed is:

1. A circuit comprising:
    a first latch having a first input and a first output, the first input of the first latch to receive a first digital signal, wherein the first latch receives a first power supply voltage and a second power supply voltage, wherein the first power supply voltage is greater than the second power supply voltage;
    a second latch having a first input and a first output, wherein the first input of the second latch is coupled to the first output of the first latch, wherein the second latch receives a third power supply voltage and a fourth power supply voltage, wherein the third power supply voltage is greater than the fourth power supply voltage, and wherein at least one of the first power supply voltage and the second power supply voltage is different than at least one of the third power supply voltage and the fourth power supply voltage;
    a third latch having a first input and a first output, the first input of the third latch to receive a second digital signal, wherein the third latch receives the first power supply voltage and the second power supply voltage;
    a fourth latch having a first input and a first output, wherein the first input of the fourth latch is coupled to the first output of the third latch, wherein the fourth latch receives a fifth power supply voltage and a sixth power supply voltage, wherein the fifth power supply voltage is greater than the sixth power supply voltage, and wherein at least one of the first power supply voltage and the second power supply voltage is different than at least one of the fifth power supply voltage and the sixth power supply voltage;
    a first transistor having at least a first terminal and a second terminal, wherein the first terminal of the first transistor is coupled to the first output of the second latch, and wherein the second terminal of the first transistor receives a first voltage;
    a second transistor having at least a first terminal and a second terminal, wherein the first terminal of the second transistor is coupled to the first output of the fourth latch, and wherein the second terminal of the second transistor receives a second voltage,
    wherein the first transistor has a first safe operating range, and wherein a first voltage range of the first output of the second latch is within the first safe operating range of the first transistor,
    and wherein the second transistor has a second safe operating range, and wherein a second voltage range of the first output of the fourth latch is within the second safe operating range of the second transistor.

2. The circuit of claim 1 further comprising:
    a first capacitor having a first terminal coupled to the first output of the first latch and a second terminal coupled to the first input of the second latch; and
    a second capacitor having a first terminal coupled to the first output of the third latch and a second terminal coupled to the first input of the fourth latch.

3. The circuit of claim 1 wherein
    the first latch further comprises a second input and a second output, the second input of the first latch to receive a complement of the first digital signal,
    the second latch further comprises a second input, wherein the second input of the second latch is coupled to the second output of the first latch,
    the third latch further comprises a second input and a second output, the second input of the third latch to receive a complement of the second digital signal, and
    the fourth latch further comprises a second input, wherein the second input of the fourth latch is coupled to the second output of the third latch.

4. The circuit of claim 3 further comprising:
    a first capacitor having a first terminal coupled to the first output of the first latch and a second terminal coupled to the first input of the second latch;
    a second capacitor having a first terminal coupled to the second output of the first latch and a second terminal coupled to the second input of the second latch;
    a third capacitor having a first terminal coupled to the first output of the third latch and a second terminal coupled to the first input of the fourth latch; and
    a fourth capacitor having a first terminal coupled to the second output of the third latch and a second terminal coupled to the second input of the fourth latch.

5. The circuit of claim 1 wherein the first voltage is the same as the third power supply voltage.

6. The circuit of claim 1 wherein the second voltage is the same as the fifth power supply voltage.

7. The circuit of claim 1 wherein the first transistor is an MOS transistor, wherein the first terminal of the first transistor is a gate, and wherein the first voltage is the third power supply voltage.

8. The circuit of claim 1 wherein the second transistor is an MOS transistor, wherein the first terminal of the second transistor is a gate, and wherein the second voltage is the fifth power supply voltage.

9. The circuit of claim 1 wherein a first difference between the first power supply voltage and the second power supply voltage is less than a second difference between the third power supply voltage and the fourth power supply voltage.

10. The circuit of claim 1 wherein third power supply voltage is the same as the fifth power supply voltage, wherein the fourth power supply voltage is the same as the sixth power supply voltage, and wherein the first voltage and the second voltage are the same as the third power supply voltage, the circuit further comprising:
    a third transistor having a first terminal coupled to the first output of the first latch and a second terminal coupled to a third voltage; and
    a fourth transistor having a first terminal coupled to the first output of the third latch and a second terminal coupled to the third voltage,
    wherein the third voltage is the same as the second power supply voltage.

11. The circuit of claim 10 wherein the first transistor further comprises a third terminal, wherein the second transistor further comprises a third terminal, wherein the third transistor further comprises a third terminal, and wherein the fourth transistor further comprises a third terminal,
    and wherein the third terminal of the first transistor is coupled to the third terminal of the third transistor, and the first transistor and third transistor are configured in series between the third power supply voltage and the second power supply voltage, and wherein the third terminal of the second transistor is coupled to the third terminal of the fourth transistor, and the second transistor and fourth transistor are configured in series between the third power supply voltage and the second power supply voltage.

12. The circuit of claim 11 further comprising one or more transistors configured between the third terminal of the first transistor and the third terminal of the third transistor.

13. The circuit of claim 1 wherein said circuit is an integrated circuit.

14. An electronic system comprising a digital to analog converter, the digital to analog converter comprising the circuit of claim 1.

15. A method comprising:

receiving a first digital signal and a second digital signal;

coupling the first digital signal into a first latch to produce a first latch output signal, wherein the first latch receives a first power supply voltage and a second power supply voltage, wherein the first power supply voltage is greater than the second power supply voltage;

coupling the first latch output signal to a second latch to produce a second latch output signal, wherein the second latch receives a third power supply voltage and a fourth power supply voltage, wherein the third power supply voltage is greater than the fourth power supply voltage, and wherein at least one of the first power supply voltage and the second power supply voltage is different than at least one of the third power supply voltage and the fourth power supply voltage;

coupling the second digital signal into a third latch to produce a third latch output signal, wherein the third latch receives the first power supply voltage and the second power supply voltage;

coupling the third latch output signal to a fourth latch to produce a fourth latch output signal, wherein the fourth latch receives a fifth power supply voltage and a sixth power supply voltage, wherein the fifth power supply voltage is greater than the sixth power supply voltage, and wherein at least one of the first power supply voltage and the second power supply voltage is different than at least one of the fifth power supply voltage and the sixth power supply voltage;

coupling the second latch output signal to a first terminal of a first transistor, the first transistor having a second terminal to receive a first voltage, coupling the fourth latch output signal to a first terminal of a second transistor, the second transistor having a second terminal to receive a second voltage, wherein the first transistor has a first safe operating range, and wherein a first voltage range of the second latch output signal is within the first safe operating range of the first transistor, and wherein the second transistor has a second safe operating range, and wherein a second voltage range of the fourth latch output signal is within the second safe operating range of the second transistor.

16. The method of claim 15 wherein the first latch output signal is coupled to the second latch through a first capacitor, and wherein the third latch output signal is coupled to the fourth latch through a second capacitor.

17. The method of claim 15 further comprising:

receiving a complement of the first digital signal and a complement of the second digital signal coupling the complement of the first digital signal into the first latch to produce a complement of the first latch output signal;

coupling the complement of the first latch output signal to the second latch;

coupling the complement of the second digital signal into the third latch to produce a complement of the third latch output signal;

coupling the complement of the third latch output signal to the fourth latch.

18. The method of claim 17 wherein:

the first latch output signal is coupled to the second latch through a first capacitor, the complement of the first latch output signal is coupled to the second latch through a second capacitor, the third latch output signal is coupled to the fourth latch through a third capacitor, and the complement of the third latch output signal is coupled to the fourth latch through a fourth capacitor.

19. The method of claim 15 wherein the first voltage is the same as the third power supply voltage, and wherein the second voltage is the same as the fifth power supply voltage.

20. The method of claim 15 wherein the first transistor is an MOS transistor, wherein the first terminal of the first transistor is a gate, and wherein the first voltage is the third power supply voltage, and wherein the second transistor is an MOS transistor, wherein the first terminal of the second transistor is a gate, and wherein the second voltage is the fifth power supply voltage.

* * * * *